(12) United States Patent
Tang

(10) Patent No.: US 6,727,150 B2
(45) Date of Patent: Apr. 27, 2004

(54) METHODS OF FORMING TRENCH ISOLATION WITHIN A SEMICONDUCTOR SUBSTRATE INCLUDING, TSHAPED TRENCH WITH SPACERS

(75) Inventor: Sanh D. Tang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/206,171

(22) Filed: Jul. 26, 2002

(65) Prior Publication Data

US 2004/0018695 A1 Jan. 29, 2004

(51) Int. Cl.⁷ .................. H01L 21/336; H01L 21/76
(52) U.S. Cl. .................. 438/296; 438/424; 438/427; 438/445; 438/430
(58) Field of Search .................. 438/424, 435, 438/427, 437, 445, 221, 699

(56) References Cited

U.S. PATENT DOCUMENTS

| | | | | |
|---|---|---|---|---|
| 4,639,288 A | * | 1/1987 | Price et al. .................. | 438/430 |
| 4,714,520 A | * | 12/1987 | Gwozdz .................. | 438/699 |
| 5,177,028 A | | 1/1993 | Manning .................. | 437/41 |
| 5,264,716 A | * | 11/1993 | Kenney .................. | 257/301 |
| 5,371,036 A | * | 12/1994 | Lur et al. .................. | 438/445 |
| 5,376,575 A | * | 12/1994 | Kim et al. .................. | 438/239 |
| 5,677,231 A | | 10/1997 | Maniar et al. .................. | 437/67 |
| 5,721,174 A | * | 2/1998 | Peidous .................. | 138/445 |
| 5,882,983 A | * | 3/1999 | Gardner et al. .................. | 438/424 |
| 5,904,517 A | | 5/1999 | Gardner et al. .................. | 438/197 |
| 6,090,661 A | | 7/2000 | Perng et al. .................. | 438/248 |
| 6,093,619 A | | 7/2000 | Huang et al. .................. | 438/400 |
| 6,165,853 A | | 12/2000 | Nuttall et al. .................. | 438/296 |
| 6,165,871 A | | 12/2000 | Lim et al. .................. | 438/437 |
| 6,180,493 B1 | | 1/2001 | Chu .................. | 438/437 |
| 6,207,532 B1 | | 3/2001 | Lin et al. .................. | 438/424 |
| 6,228,727 B1 | | 5/2001 | Lim et al. .................. | 438/296 |
| 6,232,646 B1 | | 5/2001 | Sun et al. .................. | 257/520 |
| 6,248,641 B1 | | 6/2001 | Liu et al. .................. | 438/400 |
| 6,261,922 B1 | | 7/2001 | Walker et al. .................. | 438/424 |
| 6,271,153 B1 | | 8/2001 | Moore .................. | 438/787 |
| 6,285,057 B1 | * | 9/2001 | Hopper et al. .................. | 257/330 |
| 6,300,219 B1 | | 10/2001 | Doan et al. .................. | 438/424 |
| 6,323,104 B1 | | 11/2001 | Trivedi .................. | 438/424 |
| 6,355,966 B1 | | 3/2002 | Trivedi .................. | 257/499 |
| 6,391,738 B2 | | 5/2002 | Moore .................. | 438/402 |
| 6,440,817 B2 | | 8/2002 | Trivedi | |

OTHER PUBLICATIONS

Holt et al., *A Novel T–Shaped Shallow Trench Isolation Technology*, 40 JPN. J. Appl. Phys. Part 1, No. 4B, pp. 2616–2620 (Apr. 2001).

U.S. patent application Ser. No. 09/960,119, Trivedi, filed Sep. 21, 2001.

* cited by examiner

*Primary Examiner*—John F. Niebling
*Assistant Examiner*—Ron Pompey
(74) *Attorney, Agent, or Firm*—Wells St. John P.S.

(57) ABSTRACT

A method of forming trench isolation within a semiconductor substrate includes forming a first isolation trench of a first open dimension within a semiconductor substrate. The first isolation trench has a base. A second isolation trench is formed into the semiconductor substrate through the base of the first isolation trench. The second isolation trench has a second open dimension along a line parallel with the first open dimension which is less than the first open dimension. Insulative isolation material is formed within the first and second isolation trenches. The insulative isolation material has a void therein extending from within the second isolation trench to the first isolation trench. Other aspects and implementations are contemplated.

24 Claims, 3 Drawing Sheets

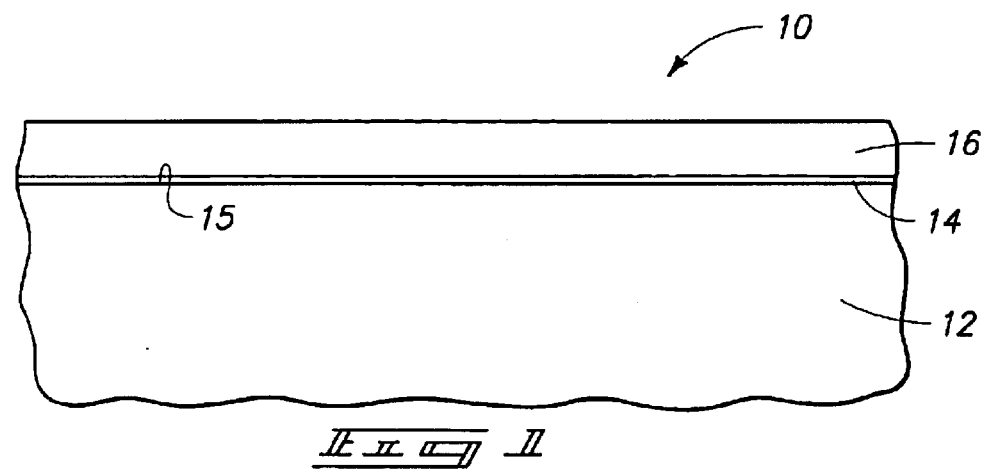
_FIG_ 1
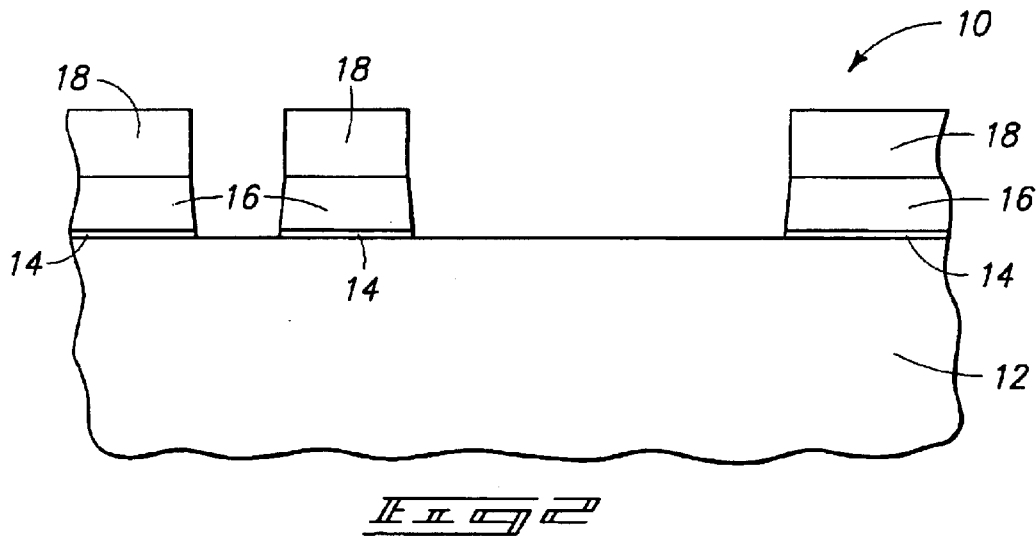
_FIG_ 2
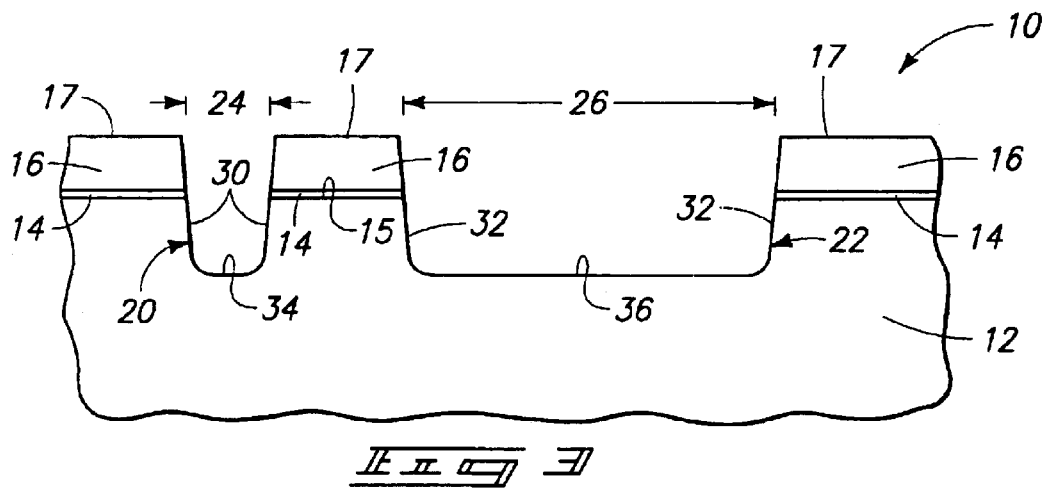
_FIG_ 3

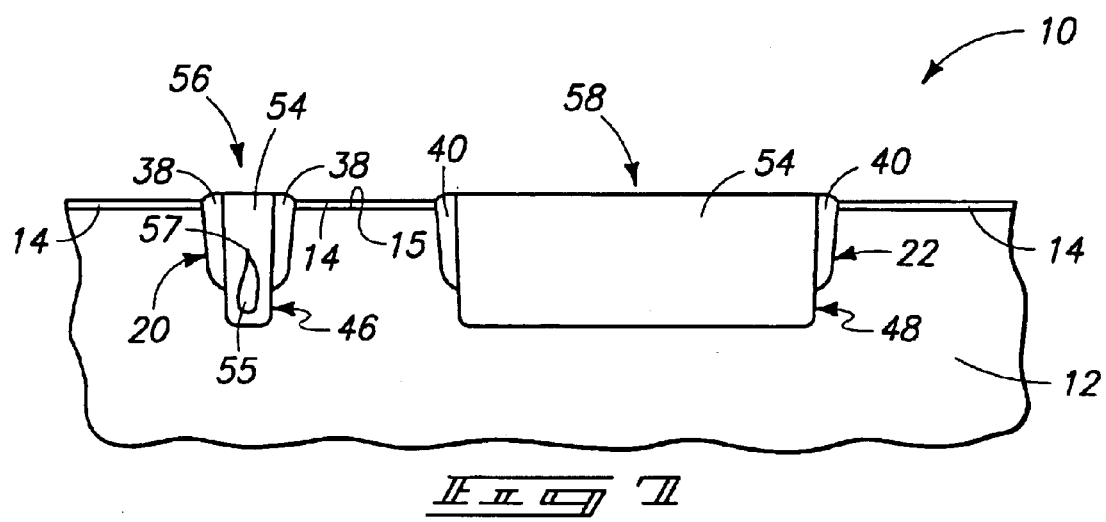
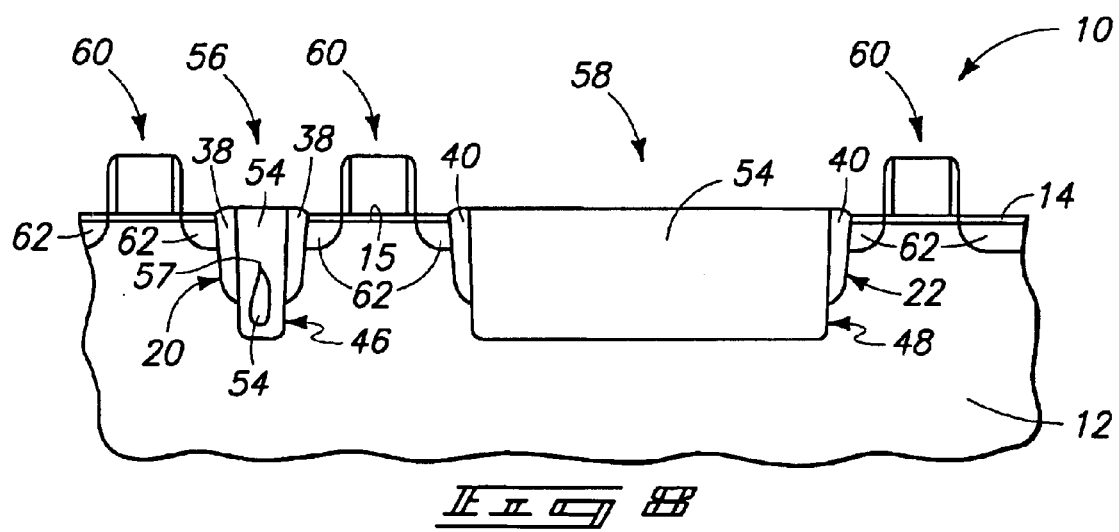

METHODS OF FORMING TRENCH ISOLATION WITHIN A SEMICONDUCTOR SUBSTRATE INCLUDING, TSHAPED TRENCH WITH SPACERS

TECHNICAL FIELD

This invention relates to methods of forming trench isolation within semiconductor substrates.

BACKGROUND OF THE INVENTION

In modern semiconductor device applications, numerous devices are packed onto a single small area of a semiconductor substrate to create an integrated circuit. Many of the individual devices are electrically isolated from one another. Accordingly, electrical isolation is an integral part of semiconductor device design for preventing unwanted electrical coupling between adjacent components and devices.

As the size of integrated circuits is reduced, the devices that make up the circuits are positioned closer together in order to comply with the limited space available on a typical semiconductor substrate. Conventional methods of isolating circuit components use trench isolation regions. Such are formed by etching trenches into a semiconductor substrate and filling the trenches with insulative material. Trench isolation regions are commonly divided into three categories: shallow trenches (STI) (trenches less than about 1 micron deep); moderate depth trenches (trenches of from about 1 to about 3 microns deep); and deep trenches (trenches greater than about 3 microns deep). As the density of components on the semiconductor substrate increased, the widths of the trenches have also decreased.

Trench isolation regions, particularly STI regions, can develop voids in the dielectric material during the process to fill the trenches. As the dielectric material flows to an edge between a substrate surface and a sidewall of the trench, constrictions develop at the top of trenches due to the narrow opening in the trench. As the dielectric material flows into the trench, the constrictions can develop into voids moving into the trench with the dielectric material.

While the invention was motivated in addressing the above issues, it is in no way so limited. The invention is only limited by the accompanying claims as literally worded (without interpretative or other limiting reference to the above background art description, remaining portions of the specification or the drawings) and in accordance with the doctrine of equivalents.

SUMMARY

The invention includes methods of forming trench isolation within semiconductor substrates. In one implementation, a method of forming trench isolation within a semiconductor substrate includes forming a first isolation trench of a first open dimension within a semiconductor substrate. The first isolation trench has a base. A second isolation trench is formed into the semiconductor substrate through the base of the first isolation trench. The second isolation trench has a second open dimension along a line parallel with the first open dimension which is less than the first open dimension. Insulative isolation material is formed within the first and second isolation trenches. The insulative isolation material has a void therein extending from within the second isolation trench to the first isolation trench.

In one implementation, a method of forming trench isolation within a semiconductor substrate includes forming a sacrificial masking layer over a semiconductor substrate. A first isolation trench of a first open dimension is etched through the sacrificial masking layer and into the semiconductor substrate. The first isolation trench has sidewalls between which the open dimension spans. The first isolation trench has a base. Anisotropically etched insulative sidewall spacers are formed over the first isolation trench sidewalls. The spacers have elevationally outermost surfaces which are received elevationally lower than an elevationally outermost surface of the sacrificial masking layer. A second isolation trench is etched into the semiconductor substrate through the base of the first isolation-trench between and substantially selectively to the sidewall spacers. The second isolation trench has a second open dimension along a line parallel with the first open dimension and is less than the first open dimension. Insulative isolation material is formed within the first and second isolation trenches.

Other aspects and implementations are contemplated.

BRIEF DESCRIPTION OF THE DRAWINGS

Preferred embodiments of the invention are described below with reference to the following accompanying drawings.

FIG. 1 is a diagrammatic sectional view of a wafer fragment at a processing step in accordance with an aspect of the invention.

FIG. 2 is a view of the FIG. 1 wafer fragment at a processing step subsequent to that shown by FIG. 1.

FIG. 3 is a view of the FIG. 2 wafer fragment at a processing step subsequent to that shown by FIG. 2.

FIG. 7 is a view of the FIG. 6 wafer fragment at a processing step subsequent to that shown by FIG. 6.

FIG. 8 is a view of the FIG. 7 wafer fragment at a processing step subsequent to that shown by FIG. 7.

DETAILED DESCRIPTION OF THE PREFERRED EMBODIMENTS

Figure 4:
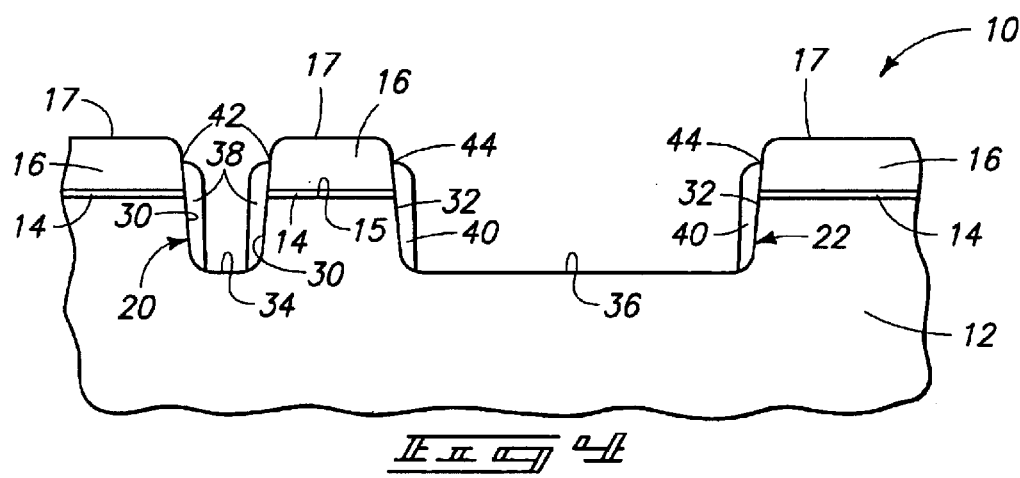
FIG. 4 is a view of the FIG. 3 wafer fragment at a processing step subsequent to that shown by FIG. 3.

This disclosure of the invention is submitted in furtherance of the constitutional purposes of the U.S. Patent Laws "to promote the progress of science and useful arts" (Article 1, Section 8).

U.S. Pat. Nos. 6,300,219, 6,355,966, and 6,440,817 are hereby fully incorporated by reference as if presented in total herein.

A method of forming trench isolation within a semiconductor substrate is described by way of example only with respect to FIGS. 1–8. FIG. 1 depicts a semiconductor substrate 10 comprising a bulk monocrystalline silicon substrate 12. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Also in the context of this document, the term "layer" encompasses both the singular and the plural unless otherwise indicated.

An oxide layer 14, such as silicon dioxide, is formed over bulk silicon substrate 12 to form a pad/protection oxide layer. Such could be formed by any technique, such as thermally oxidizing the outer surface of substrate 12 in a steam ambient at 800° C. to 1100° C. for from one minute to 120 minutes, to form a substantially undoped silicon dioxide layer 14 to an exemplary thickness of from 40 Angstroms to 200 Angstroms. Another layer 16 is formed thereover, for example silicon nitride, for example by chemical vapor deposition. Collectively, layers 14 and 16 can be considered as a sacrificial masking layer formed as part of semiconductor substrate 10.

Referring to FIG. 2, a masking layer 18, for example photoresist, has been formed over layer 16 and patterned as shown. Using such as a mask, silicon nitride layer 16 and pad oxide layer 14 have been etched substantially selectively relative to substrate 12, using any etching chemistry or chemistries and whether existing or yet-to-be developed.

Referring to FIG. 3, layer 18 has been removed and first isolation trenches 20, 22 have been etched through sacrificial masking layer 14/16 and into semiconductive material 12 of semiconductor substrate 10. Such forms first isolation trench sidewalls 30 and 32 within first isolation trenches 20 and 22, respectively. Such also forms first isolation trenches 20 and 22 to have respective bases 34 and 36. Such also defines respective first open dimensions 24 and 26 spanning between the respective sidewalls 30 and 32 at a surface 15 of semiconductive material 12. An example depth of bases 34 and 36 from surface 15 is from 1000 Angstroms to 2000 Angstroms. An example width for base 34 is 0.15 micron. An example etch chemistry for anisotropically etching of substrate 12 includes $CF_4$, HBr and $CH_2F_2$. Of course, other polymerizing gases can be used, i.e., $CHF_3$, etc. Such provides but one example of forming a first isolation trench of a first open dimension within semiconductive material of a semiconductor substrate, with any other method being contemplated whether existing or yet-to-be developed, and including non-etching methods. For purposes of the continuing discussion, masking layer 14, 16 can be considered as having an elevationally outermost surface 17.

Referring to FIG. 4, anisotropically etched insulative sidewall spacers 38 and 40 are formed over the respective first isolation trench sidewalls 30 and 32. Spacers 38 and 40 have elevationally outermost surfaces 42 and 44, respectively, which are received elevationally lower than elevationally outermost surface 17 of sacrificial masking layer 14/16. Exemplary preferred materials for the spacers include silicon dioxide (i.e., from decomposition of tetraethylorthosilicate), silicon nitride, $Si_xN_yO_z$, $Al_2O_3$, $Ta_2O_5$ and mixtures thereof. Preferably, "x" ranges from 0.39 to 0.65, "y" ranges from 0.02 to 0.56, and "z" ranges from 0.05 to 0.33. An exemplary method of forming the same is to deposit a layer or layers from which spacers 38 and 44 are formed to an exemplary thickness of from 50 Angstroms to 400 Angstroms, with from 100 Angstroms to 300 Angstroms being more preferred. Such are then anisotropically etched, and preferably sufficiently over-etched to form outermost surfaces 42 and 44 elevationally inward of masking layer surface 17. An example etch chemistry for achieving the illustrated etch where the spacer forming layer predominantly comprises $Si_xN_yO_z$ includes $CF_4$, $CHF_3$ and $CH_2F_2$. An example etching chemistry where the spacer forming layer predominantly comprises $Al_2O_3$ includes $CF_4$, $CHF_3$, Cl and $CH_2F_2$. An example chemistry where the spacer forming layer comprises $Ta_2O_5$ includes $CF_4$, $CHF_3$, Cl and $NF_3$. Exemplary chemistries where the spacer forming layer comprises silicon dioxide or silicon nitride include $CF_4$, $SF_6$, and/or $NF_3$. Regardless, the etching preferably results to form spacers 38 and 44 to have exemplary width thicknesses of from 50 Angstroms to about 400 Angstroms, and more preferably from about 150 Angstroms to about 300 Angstroms. Such etching further preferably exposes trench bases 34 and 36.

Figure 5:
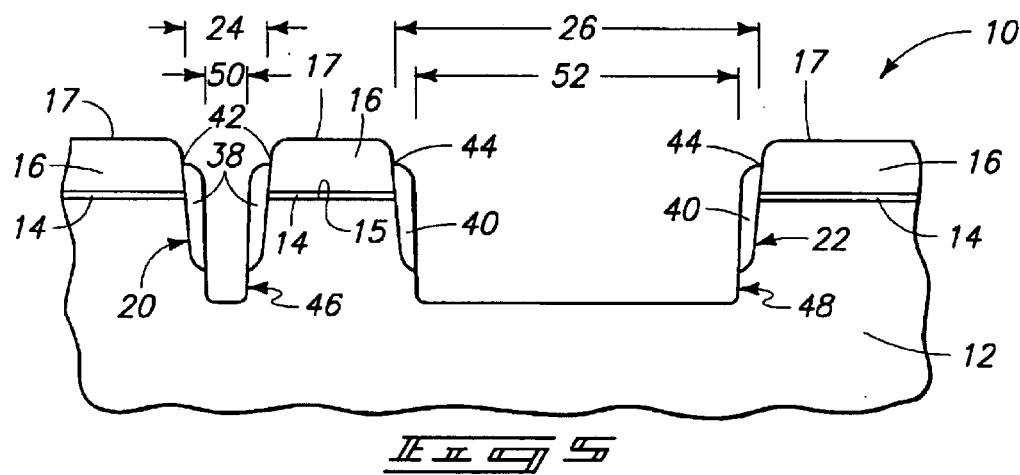
FIG. 5 is a view of the FIG. 4 wafer fragment at a processing step subsequent to that shown by FIG. 4.

Referring to FIG. 5, second isolation trenches 46 and 48 are etched into semiconductive material 12 of semiconductor substrate 10 through bases 34 and 36, respectively, of first isolation trenches 20 and 22, respectively, between and substantially selective to sidewall spacers 38 and 40. In the context of this document, substantially selectively includes an etch removal ratio of one material relative to another of at least 2:1. An exemplary preferred chemistry to produce the FIG. 5 construction includes the same as that above to produce trenches 20 and 22. Second trenches 46 and 48 might be etched to the same, an equal, or greater thickness than the etching that produces first trenches 20 and 22. An exemplary second trench etching depth is an additional 2500 Angstroms of material 12. Such produces second isolation, second open dimensions 50 and 52 along lines parallel with first open dimensions 24 and 26, respectively, which are less than first open dimensions 24 and 26, respectively. Further in the illustrated preferred embodiment, second trench second open dimensions 50 and 52 are centered within first trench first open dimensions 24 and 26, respectively.

Such provides but one example of forming such second isolation trenches, which includes in the example the etching of semiconductive material 12 of substrate 10. Other techniques and materials might be utilized, also, such as and by way of example only, photoresist and etch. Any other removal or other technique, whether existing or yet-to-be developed, is of course also contemplated. Further preferably after the formation of second isolation trenches 46 and 48, the substrate is subjected to an oxidation to repair dangling bonds formed at any of the exposed silicon surfaces, and/or at silicon surfaces underlying spacers 38 and 40. An exemplary technique to achieve the same includes an atmosphere of $H_2O$ vapor and/or an oxygen ambient in a furnace by RTP or other means. Such thermal oxidizing is preferred and, of course, might be conducted later or earlier (or both) in the exemplary preferred embodiment.

Figure 6:
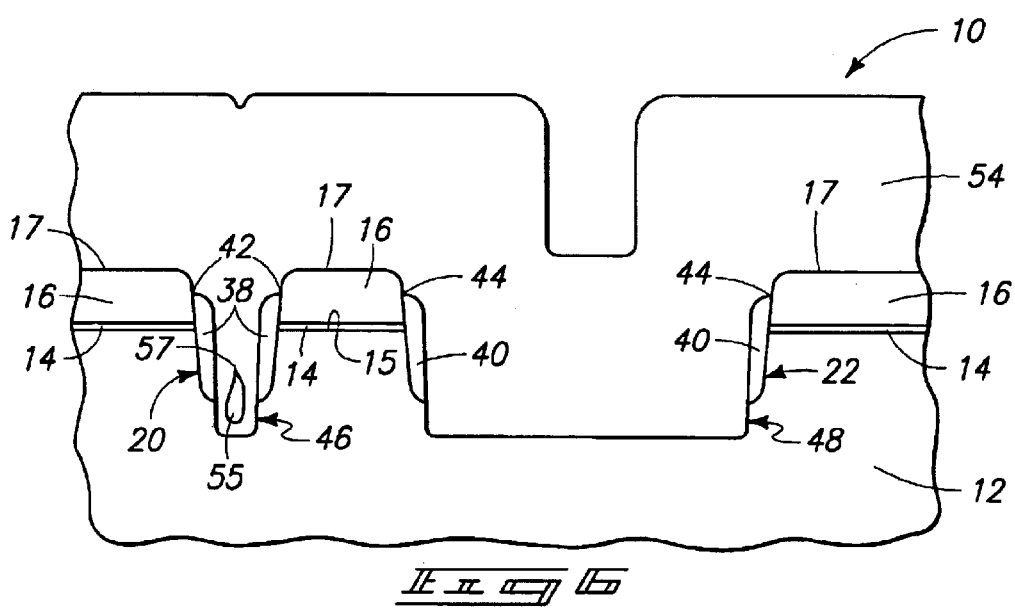
FIG. 6 is a view of the FIG. 5 wafer fragment at a processing step subsequent to that shown by FIG. 5.

Referring to FIG. 6, an insulative isolation material is deposited within the respective trenches as shown. An example and preferred material is high density plasma deposited silicon dioxide from the decomposition of tetraethylorthosilicate. By way of example only, alternate materials such as silicon nitride are also of course contemplated. FIG. 6 depicts a void 55 within the left illustrated isolation trench construction, and with no such void being formed in the right illustrated isolation trench construction. Void 55 has a void defining elevationally outermost surface 57 which is received elevationally lower than elevationally outermost surface 15 of semiconductive material 12 of semiconductor substrate 10 within which isolation material 54 is received. Further in the illustrated embodiment, void 55 extends from within second isolation trench 46 to first isolation trench 20.

Referring to FIG. 7, insulative isolation material 54 and sacrificial masking layer 14/16 have been planarized back outwardly of substrate 12, for example by chemical-mechanical polishing and/or etch. Preferred thermal pad oxide layer 14 can be etched (i.e., using an anhydrous HF vapor having less than 0.1% water, $N_2$ and $CH_3OH$ at a temperature of 120° C. and a pressure of 100 Torr, or using a wet strip using 100:1 HF) to outwardly expose substrate material 12. In this preferred embodiment, such is effective to form trench isolation regions 56 and 58 which comprise both the anisotropically etched sidewall spacers and the insulative isolation material. Contemplated but less preferred in certain aspects would be the removal of spacers 38 and 40 immediately prior to forming insulative isolation filling material 54.

Referring to FIG. 8, field effect transistor gates 60 and associated junction regions 62 are formed over substrate 12.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming trench isolation within a semiconductor substrate, comprising:

forming a first isolation trench of a first open dimension within semiconductive material of a semiconductor substrate, the first isolation trench having sidewalls between which the open dimension spans, the first isolation trench having a base;

forming anisotropically etched insulative sidewall spacers over the first isolation trench sidewalls, the spacers having an upper half and a lower half, the upper half having a maximum lateral thickness which is greater than a maximum lateral thickness of the lower half;

etching a second isolation trench into the semiconductive material of the semiconductor substrate through the base of the first isolation trench between and substantially selectively to the sidewall spacers, the second isolation trench having a second open dimension along a line parallel with the first open dimension and which is less than the first open dimension; and forming insulative isolation material within the first and second isolation trenches effective to form trench isolation which comprises both the anisotropically etched sidewall spacers and the insulative isolation material.

2. The method of claim 1 wherein the insulative isolation material has a void therein, the insulative isolation material void extending from within the second isolation trench to the first isolation trench.

3. The method of claim 2 wherein the void has a void defining elevationally outermost surface which is received elevationally lower than an elevationally outermost surface of the semiconductive material of the semiconductor substrate within which the trench isolation is received.

4. The method of claim 2 wherein, the first and second trenches are formed within a bulk monocrystalline silicon substrate; and the void has a void defining elevationally outermost surface which is elevationally lower than an elevationally outermost surface of the bulk monocrystalline silicon.

5. A method of forming trench isolation within a semiconductor substrate, comprising:

forming a sacrificial masking layer over a semiconductor substrate, the sacrificial masking layer having an elevationally outermost surface and having an elevationally innermost surface;

etching a first isolation trench of a first open dimension through the sacrificial masking layer and into semiconductive material of the semiconductor substrate, the first isolation trench having sidewalls between which the open dimension spans, the first isolation trench having a base;

forming anisotropically etched insulative sidewall spacers over the first isolation trench sidewalls, the spacers having elevationally outermost surfaces which are received elevationally lower than the elevationally outermost surface of the sacrificial masking layer and elevationally higher than the elevationally innermost surface of the sacrificial masking layer the spacers having an upper half and a lower half, the upper half having a maximum lateral thickness which is greater than a maximum lateral thickness of the lower half;

etching a second isolation trench into the semiconductive material of the semiconductor substrate through the base of the first isolation trench between and substantially selectively to the sidewall spacers, the second isolation trench having a second open dimension along a line parallel with the first open dimension and which is less than the first open dimension; and forming insulative isolation material within the first and second isolation trenches, the insulative isolation material having a void therein extending from within the second isolation trench to the first isolation trench, the void having a narrowest open dimension along a line parallel with the first and second open dimensions, said narrowest open dimension being located with the first isolation trench and not within the second isolation trench.

6. The method of claim 5 wherein the sacrificial masking layer comprises silicon dioxide.

7. The method of claim 5 wherein the sacrificial masking layer comprises silicon nitride.

8. The method of claim 5 wherein the sacrificial masking layer comprises silicon dioxide and silicon nitride.

9. The method of claim 5 comprising removing the spacers prior to forming the insulative isolation material.

10. The method of claim 5 wherein the forming of insulative isolation material within the first and second isolation trenches is effective to form trench isolation which comprises both the anisotropically etched sidewall spacers and the insulative isolation material.

11. The method of claim 5 wherein the first and second trenches are formed within a bulk monocrystalline silicon substrate.

12. The method of claim 5 wherein the void has a void defining elevationally outermost surface which is received elevationally lower than an elevationally outermost surface of the semiconductive material of the semiconductor substrate within which the trench isolation is received.

13. The method of claim 5 wherein, the first and second trenches are formed within a bulk monocrystalline silicon substrate; and the avoid has a void defining elevationally outermost surface which is elevationally lower than an elevationally outermost surface of the bulk monocrystalline silicon.

14. A method of forming trench isolation within a semiconductor substrate, comprising:

forming a sacrificial masking layer over a semiconductor substrate, the sacrificial masking layer having an elevationally outermost surface and having an elevationally innermost surface;

etching a first isolation trench of a first open dimension through the sacrificial masking layer and into semiconductive material of the semiconductor substrate, the first isolation trench having sidewalls between which the open dimension spans, the first isolation trench having a base;

forming anisotropically etched insulative sidewall spacers over the first isolation trench sidewalls, the spacers having elevationally outermost surfaces which are received elevationally lower than the elevationally outermost surface of the sacrificial masking layer and elevationally higher than the elevationally innermost surface of the sacrificial masking layer; the spacers having an upper half and a lower half, the upper half having a maximum lateral thickness which is greater than a maximum lateral thickness of the lower half;

etching a second isolation trench into the semiconductive material of the semiconductor substrate through the base of the first isolation trench between and substantially selectively to the sidewall spacers, the second isolation trench having a second open dimension along a line parallel with the first open dimension and which is less than the first open dimension; and forming insulative isolation material within the first and second isolation trenches effective to form trench isolation which comprises both the anisotropically etched sidewall spacers and the insulative isolation material.

15. The method of claim 14 wherein the insulative isolation material has a void therein extending from within the second isolation trench to the first isolation trench, the void having a void defining elevationally outermost surface which is received elevationally lower than an elevationally outermost surface of the semiconductive material of the semiconductor substrate within which the trench isolation is received.

16. The method of claim 14 wherein the first and second trenches are formed within a bulk monocrystalline silicon substrate.

17. The method of claim 14 wherein, the first and second trenches are formed within a bulk monocrystalline silicon substrate; and the insulative isolation material has a void therein extending from within the second isolation trench to the first isolation trench, the void having a void defining elevationally outermost surface which is elevationally lower than an elevationally outermost surface of the bulk monocrystalline silicon.

18. The method of claim 14 wherein the sidewall spacers and the isolation material each comprise silicon dioxide.

19. The method of claim 14 wherein the sidewall spacers and the isolation material comprise silicon nitride.

20. The method of claim 14 wherein the sidewall spacers and the isolation material comprise different materials.

21. The method of claim 14 wherein the sidewall spacers comprises silicon nitride and the isolation material comprises silicon dioxide.

22. The method of claim 14 wherein the sidewall spacers comprises silicon dioxide and the isolation material comprises silicon nitride.

23. The method of claim 1 wherein the insulative isolation material has a void therein extending from within the second isolation trench to the first isolation trench, the void having a narrowest open dimension along a line parallel with the first and second open dimensions, said narrowest open dimension being located with the first isolation trench and not within the second isolation trench.

24. The method of claim 14 wherein the insulative isolation material has a void therein extending from within the second isolation trench to the first isolation trench, the void having a narrowest open dimension along a line parallel with the first and second open dimensions, said narrowest open dimension being located with the first isolation trench and not within the second isolation trench.

* * * * *

UNITED STATES PATENT AND TRADEMARK OFFICE
CERTIFICATE OF CORRECTION

PATENT NO. : 6,727,150 B2
DATED : April 27, 2004
INVENTOR(S) : Sanh D. Tang

It is certified that error appears in the above-identified patent and that said Letters Patent is hereby corrected as shown below:

Title page,
Item [56], References Cited, OTHER PUBLICATIONS, "Holt et al." reference, please delete "Holt et al." before "*A Novel T-Shaped Shallow Trench Isolation*" and insert -- Hong et al. --.

Column 6,
Line 57, please delete "avoid" after "the" and insert -- void --.

Signed and Sealed this

Eighth Day of February, 2005

JON W. DUDAS
*Director of the United States Patent and Trademark Office*